(12) United States Patent
Muranaka et al.

(10) Patent No.: US 6,340,253 B1
(45) Date of Patent: Jan. 22, 2002

(54) RESIST PEELING SYSTEM AND CONTROL METHOD OF A RESIST PEELING SOLUTION

(75) Inventors: Seiji Muranaka; Hiroshi Tanaka; Yoshiyuki Hori, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/610,656

(22) Filed: Jul. 5, 2000

(30) Foreign Application Priority Data

Feb. 10, 2000 (JP) ............................................. 12-033789

(51) Int. Cl.[7] ................................................ G03D 5/00
(52) U.S. Cl. ....................... 396/611; 396/578; 396/626; 510/176
(58) Field of Search .................................. 396/604, 611, 396/626; 430/5, 311; 134/1, 2, 38, 902; 156/233; 510/176

(56) References Cited

U.S. PATENT DOCUMENTS 5,364,510 A * 11/1994 Carpio .................... 204/153.1
6,027,760 A * 2/2000 Gurer et al. ................. 427/240

FOREIGN PATENT DOCUMENTS

| JP | 03-269348 | * | 11/1991 |
| JP | 8-146622 | | 6/1996 |
| JP | 10-22261 | * | 1/1998 |
| JP | 10-143255 | * | 5/1998 |

* cited by examiner

Primary Examiner—D. Rutledge
(74) Attorney, Agent, or Firm—McDermott, Will & Emery

(57) ABSTRACT

A resist peeling system includes a peeling solution tank for storing a resist peeling solution; an electric conductivity monitor for monitoring the electric conductivity of a resist peeling solution; and a additive components tank for estimating the components ratio in the resist peeling solution on the basis of the electric conductivity thereof and adding, when a component of the resist peeling solution is estimated to be insufficient on the basis of the estimated result, the component lacking for the resist peeling solution to the resist peeling solution by a suitable amount.

13 Claims, 2 Drawing Sheets

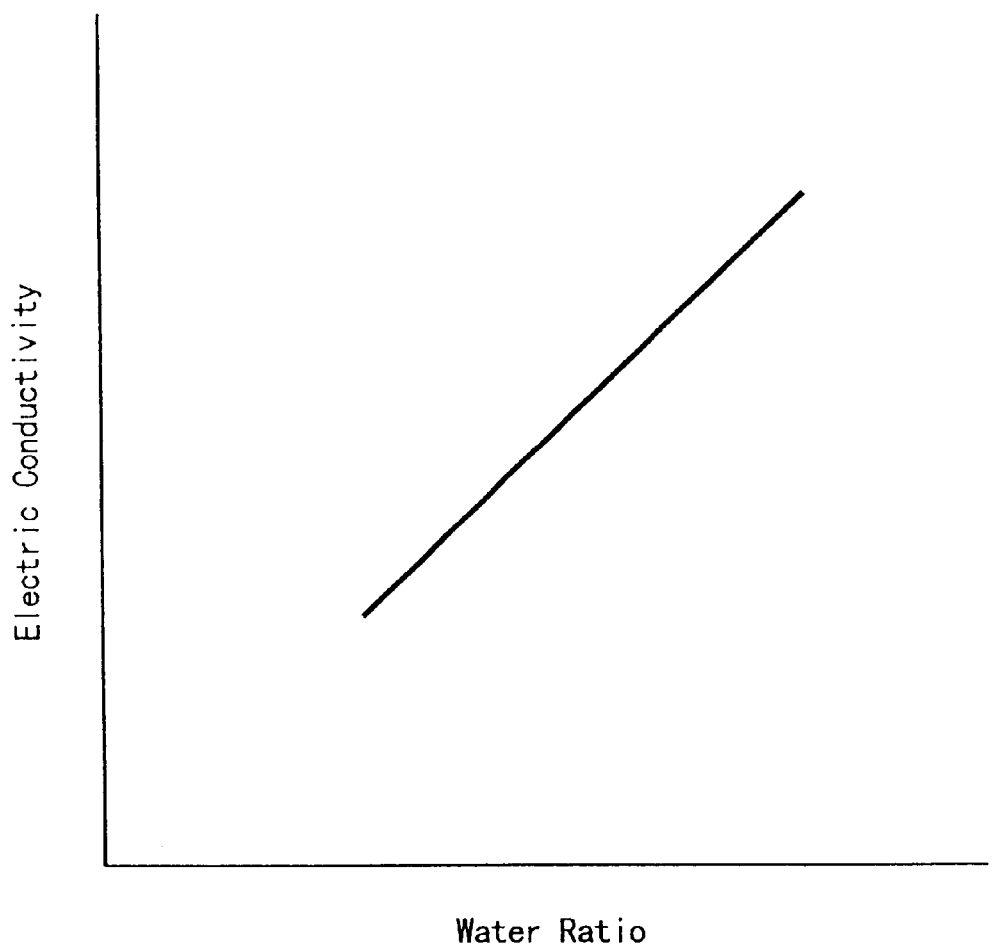

RESIST PEELING SYSTEM AND CONTROL METHOD OF A RESIST PEELING SOLUTION

BACKGROUND OF THE INVENTION

1. Field of the Invention

The present invention relates to a resist peeling system and a control method of a resist peeling solution, and particularly to a resist peeling system used for peeling resist residue on a semiconductor wafer, and a control method for suitably controlling the state of the resist peeling solution.

2. Description of the Background Art

In the process for fabricating semiconductor integrated circuits, a treatment for removing resist residue remaining on a semiconductor wafer, that is, a resist peeling treatment is performed after dry etching for forming interconnections and holes. In the resist peeling treatment, a resist peeling solution containing organic amine and the like cleans the semiconductor wafer.

The components ratio in a resist peeling solution changes with time. In particular, the components ratio in an amine based peeling solution that is common as a resist peeling solution is apt to change significantly, since it is used under a high temperature environment. The change in components ratio in the resist peeling solution may cause an inconvenience that interconnections on a wafer are excessively etched with the resist peeling solution or the residue removing ability of the resist peeling solution is degraded.

To solve such an inconvenience, in the process of fabricating a semiconductor integrated circuit, a manner of periodically exchanging a resist peeling solution is generally adopted; however, such an exchange of the resist peeling solution results in increased production costs of semiconductor integrated circuits. Accordingly, in order to reduce the production costs of semiconductor integrated circuits, it is essential to reduce the cost of the resist peeling solution, and more concretely, to prolong the service life of the resist peeling solution.

SUMMARY OF THE INVENTION

The present invention has been implemented in order to solve the above-described problems, and a first object of the present invention is to provide a resist peeling system capable of prolonging the service life of a resist peeling solution by keeping the components ratio in the same in a suitable range.

A second object of the present invention is to provide a method of controlling a resist peeling solution, which method is capable of prolonging the service life of a resist peeling solution by keeping the components ratio in the same in a suitable range.

The above objects of the present invention are achieved by a resist peeling system for peeling resist residue adhering on a semiconductor wafer by using a resist peeling solution composed of multiple components. The resist peeling system includes a peeling solution tank for storing the resist peeling solution as well as an electric conductivity monitor for monitoring the electric conductivity of the resist peeling solution. The resist peeling system also includes a unit for estimating the components ratio in the resist peeling solution on the basis of the electric conductivity. The resist peeling system further includes a component adding mechanism. The component adding mechanism adds a suitable amount of a component of the resist peeling solution to the resist peeling solution when the electric conductivity monitor estimates that there is an insufficient amount of the component in the resist peeling solution.

The above objects of the present invention are achieved by a method of controlling a resist peeling solution composed of multiple components for peeling resist residue adhering on a semiconductor wafer. In the method, there is monitored the electric conductivity of the resist peeling solution stored in a peeling solution tank. The ratio of the components in the resist peeling solution is estimated on the basis of the electric conductivity. When a component of the resist peeling solution is estimated to be insufficient on the basis of the estimated result, a suitable amount of the insufficient component is added to the resist peeling solution.

Other objects and further features of the present invention will be apparent from the following detailed description when read in conjunction with the accompanying drawings.

BRIEF DESCRIPTION OF THE DRAWINGS

FIG. 3 is a graph showing a relationship between the electric conductivity of a resist peeling solution and a water ratio in the resist peeling solution.

DESCRIPTION OF THE PREFERRED EMBODIMENTS

Figure 1:
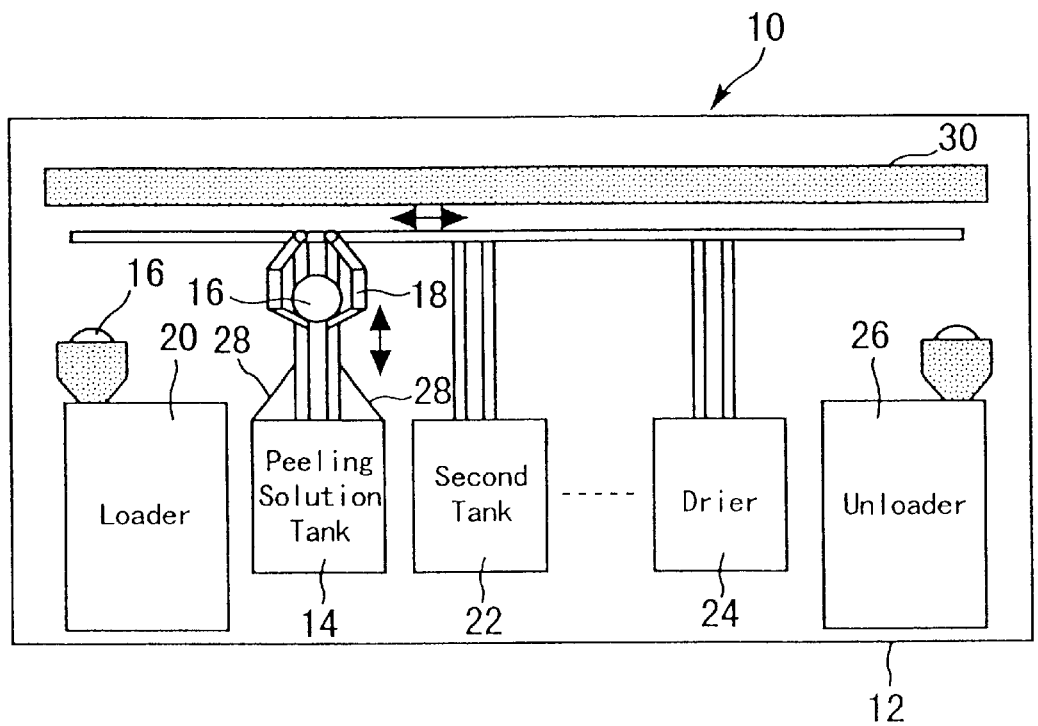
FIG. 1 is a diagram showing the entire configuration of a resist peeling system according to a first embodiment of the present invention.

In the following, principles and embodiments of the present invention will be described with reference to the accompanying drawings. The members and steps that are common to some of the drawings are given the same reference numerals and redundant descriptions therefor may be omitted.

First Embodiment

FIG. 1 is a diagram showing the entire configuration of a resist peeling system according to a first embodiment of the present invention. A resist peeling system 10 is provided with a plurality of tanks including a peeling solution tank 14 in a space surrounded by an outer wall 12. A loader 20 for delivering semiconductor wafers 16 to a carrying arm 18 is disposed in front of the peeling solution tank 14. A second tank 22 serving as a rinse tank or water-washing tank, a drier 24, and the like are disposed behind the peeling solution tank 14. An unloader 26 for receiving the semiconductor wafers 16 from the carrying arm 18 is disposed behind the drier 24.

The semiconductor wafers 16 carried in the resist peeling system 10 are delivered from the loader 20 to the carrying arm 18 on a lot basis. The carrying arm 18 moves in the resist peeling system 10 to carry the semiconductor wafers 16 to the peeling solution tank 14, second tank 22, or drier 24 in sequence and to deliver the semiconductor wafers 16 to the unloader 26. A lid 28, which opens only upon carry-in/carry-out of the semiconductor wafers 16, is provided to cover each of the tanks including the peeling solution tank 14. Accordingly, a specific treatment at each tank is performed in the enclosed inner space of the tank.

The resist peeling system 10 has an exhaust port 30 for exhausting air in the system to the outside. The exhaust port 30 extends in the longitudinal direction of the resist peeling system 10 for sucking air in the system over a wide range.

A controllable exhaust pressure is introduced to the exhaust port 30. The resist peeling system 10 can adjust the exhaust ability of the exhaust port 30 by controlling the exhaust pressure.

Figure 2:
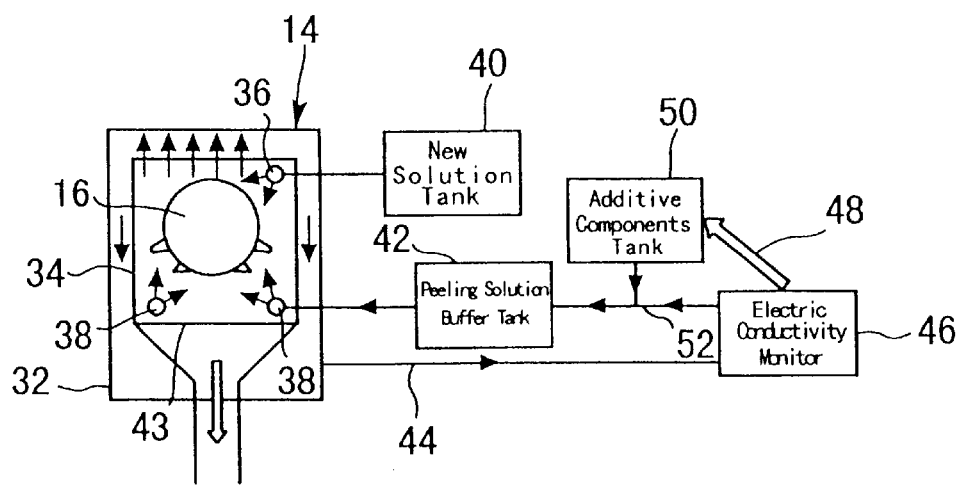
FIG. 2 is a conceptual diagram illustrating the structure of a peeling solution tank provided in the resist peeling system shown in FIG. 1.

FIG. 2 is a conceptual diagram illustrating the structure of the peeling solution tank 14. The peeling solution tank 14 includes an outer tank 32 and an inner tank 34. A resist peeling solution is stored in the outer tank 32 and the inner tank 34. The resist peeling solution used in this embodiment is a general solution, i.e., an amine based resist peeling solution containing a plurality of components such as water, organic amine, an organic solvent, and other additives.

As shown in FIG. 2, the semiconductor wafer 16 is dipped in the resist peeling solution stored in the inner tank 34. A new-solution supply port 36 and a circulating-solution supply port 38 are provided in the inner tank 34. A new-solution tank 40 for storing a new-solution at room temperature is communicated to the new-solution supply port 36. The new-solution stored in the new-solution tank 40 can be supplied in the inner tank 34 through the new-solution supply port 36, as needed. A peeling solution buffer tank 42 is communicated to the circulating-solution supply port 38. A resist peeling solution adjusted at the same temperature as that of the resist peeling solution in the peeling solution tank 14 is stored in the peeling solution buffer tank 42. The resist peeling solution stored in the peeling solution buffer tank 42 can be supplied in the inner tank 34 through the circulating-solution supply port 38, as needed.

The bottom surface of the inner tank 34 has an openable/closable solution discharge port 43 having a sufficiently large diameter. By use of the solution discharge port 43, the resist peeling solution stored in the inner tank 34 can be discharged for a very short time. Such a function of solution discharge is hereinafter referred to as "Quick Dump".

The inner tank 34 opens upwardly in the outer tank 32. Accordingly, the resist peeling solution in the inner tank 34 flows in the outer tank 32. An electric conductivity monitor 46 is communicated to the outer tank 32 via a circulating path 44. The electric conductivity monitor 46 is a unit for measuring the electric conductivity of the resist peeling solution supplied from the outer tank 32 via the circulating path 44, and generating a control signal 48 on the basis of the measured result.

The control signal 48 generated by the electric conductivity monitor 46 is supplied to an additive components tank 50. The additive components tank 50 stores separately water and organic amine that are main components of the resist peeling solution, and supplies suitable amounts of water and organic amine to the circulating path 52 on the basis of the control signal 48. The component (water or organic amine) supplied from the additive components tank 50 is heated in the peeling solution buffer tank 42 together with the resist peeling solution flowing through the electric conductivity monitor 46, and is supplied to the inner tank 34.

The operation of the resist peeling system 10 according to this embodiment will be described below.

In the fabrication process for a semiconductor integrated circuit, the semiconductor wafer 16 is subjected to treatments such as dry etching for forming interconnections and holes. Directly after dry etching, a resist residue remains adhering on the surface of the semiconductor wafer 16. The semiconductor wafers 16 on the surfaces of which resist residue remains adhering as described above are carried in the resist peeling system 10 of this embodiment. The semiconductor wafers 16 are first carried in the peeling solution tank 14 by the carrying arm 18.

The resist peeling solution heated at a specific temperature is stored in the peeling solution tank 14. The semiconductor wafers 16 are each dipped in the resist peeling solution and are cleaned by the resist peeling solution. After cleaning of the semiconductor wafer 16 in the peeling solution tank 14 for a specific time, the semiconductor wafer 16 is carried out of the peeling solution tank 14 by the carrying arm 18 and then carried in the second tank 22. After that, the semiconductor wafer 16 is subjected to rinsing and water-washing, being dried, and is carried out of the resist peeling system 10. The semiconductor wafer 16 thus carried out of the resist peeling system 10 will be processed into semiconductor devices in accordance with the known procedure.

The components ratio in the resist peeling solution stored in the peeling solution tank 14 changes with time due to the fact that the resist peeling solution is kept in the state being heated at a specific temperature in the resist peeling system 10 or that the carry-out of the resist peeling solution by adhesion thereof on the semiconductor wafer 16 is repeated. The change of the composition with time is mainly dependent on evaporation of water in the resist peeling solution.

In general, various resist peeling solutions have a correlation between the composition and the electric conductivity thereof. With respect to the resist peeling solution used in this embodiment, there is a linear relationship between the water ratio and the electric conductivity thereof shown in FIG. 3. Accordingly, for the resist peeling system 10 in this embodiment, the components ratio in the resist peeling solution can be somewhat estimated on the basis of the electric conductivity thereof.

The resist peeling system 10 in this embodiment includes the electric conductivity monitor 46 for monitoring the electric conductivity of the resist peeling solution in the peeling solution tank 14 in real time. Further, the resist peeling system 10 previously stores a relationship between the water ratio and the electric conductivity of the resist peeling solution shown in FIG. 3. Accordingly, the resist peeling system 10 can estimate the water ratio in the resist peeling solution in real time on the basis of the electric conductivity of the resist peeling solution.

In the amine based resist peeling solution used in this embodiment, to be more specific, not only the water ratio but also the organic amine ratio changes. As a result, there is a linear relationship between the organic amine ratio and the electric conductivity, which is similar to that shown in FIG. 3. Such a relationship, however, does not largely appear as compared with the relationship between the water ratio and the electric conductivity, and therefore, it is difficult to detect the organic amine ratio on the basis of the change in electric conductivity under the environment in which the water ratio significantly changes.

On the other hand, for the amine based resist peeling solution, there is a certain correlation between the changed amount of the water ratio and the changed amount of the organic amine ratio. Accordingly, the organic amine ratio can be somewhat estimated by monitoring the change in water ratio. The resist peeling system 10 in this embodiment previously stores information necessary for the above-described estimation. Accordingly, the resist peeling system 10 can accurately estimate the components ratio in the resist peeling solution (water ratio, organic amine ratio, and ratios of other components) by monitoring the electric conductivity of the resist peeling solution.

The resist peeling system 10 estimates the water ratio and the organic amine ratio in accordance with the above-described manner, and generates the control signal 48 on the basis of the estimated values. The additive components tank 50 receives the control signal 48 and supplies, to the peeling solution buffer tank 42, water in an amount to be added for keeping the water ratio in the resist peeling solution stored in the peeling solution tank 14 within a standard range and organic amine in an amount to be added for keeping the organic amine ratio in the resist peeling solution stored in the resist peeling solution tank 14 within a standard range.

The added component supplied from the additive components tank 50 flows in the peeling solution buffer tank 42 together with the resist peeling solution having flowed through the electric conductivity monitor 46, being heated at a suitable temperature in the peeling solution buffer tank 42, and is supplied to the peeling solution tank 14 from the circulating-solution supply port 38. The supply of the added component to the peeling solution tank 14 after heating of the added component is effective to stabilize the temperature of the inside of the peeling solution tank 14, that is, stabilize the treatment condition for peeling the resist.

As shown in FIG. 2, the resist peeling system 10 in this embodiment performs the addition of the components of the resist peeling solution on the upstream side from the peeling solution tank 14, and performs the monitoring of the electric conductivity of the resist peeling solution on the downstream side from the peeling tank 14. With this configuration, it is possible to prevent the added components from instantly exerting an effect on the results detected by the electric conductivity monitor 46. As a result, according to the resist peeling system in this embodiment, it is possible to obtain data with a high reliability by the electric conductivity monitor 46.

Hereinafter, the procedure of adding the components such as water and organic amine to the circulating resist peeling solution, which is performed in the resist peeling system 10 in this embodiment, will be more fully described.

The resist peeling system 10 divides the factor of changing the components ratio in the resist peeling solution into the following two factors, and replenishes the necessary components of the resist peeling solution in accordance with the manner corresponding to each factor. The first factor is a steady change in the resist peeling solution, which is caused even in a stand-by state of the resist peeling system 10. To compensate the change in components ratio in the resist peeling solution on the basis of the first factor, the resist peeling system 10 continuously replenishes the necessary components to the resist peeling solution. Hereinafter, such a manner is referred to as "continuous replenishment".

The second factor is a change caused by treatment of the semiconductor wafers 16 on a lot basis, more concretely, a change caused by carry-out of the resist peeling solution due to adhesion thereof on the semiconductor wafers 16 and evaporation of components of the resist peeling solution accompanied by opening/closing of the lid 28 upon carry-in/carry-out of the semiconductor-wafers 16. To compensate the change in components ratio in the resist peeling solution on the basis of the second factor, the resist peeling system 10 intermittently replenishes the necessary components to the resist peeling solution. Hereinafter, such a manner is referred to as "intermittent replenishment".

The resist peeling system 10 in this embodiment performs continuous replenishment in accordance with either of three kinds of the procedures of:

(1) keeping the exhaust ability of the exhaust port 30 constant, and increasing/decreasing the added amounts of the necessary components on the basis of the electric conductivity of the resist peeling solution;

(2) suitably increasing/decreasing the added amounts of the necessary components on the basis of the electric conductivity of the resist peeling solution, and simultaneously adjusting the exhaust ability of the exhaust port 30 on the basis of the electric conductivity; and (3) keeping the added amounts of the necessary components constant, and adjusting the exhaust ability of the exhaust port 30 on the basis of the electric conductivity of the resist peeling solution.

The components ratio in the resist peeling solution in the peeling solution tank 14 can be directly adjusted by adjusting the added amounts of the necessary components. Since the vaporated amounts of the components (particularly, water) of he resist peeling solution per unit time change depending on the exhaust ability of the exhaust port 30, the components ratio in the resist peeling solution in the peeling solution tank 14 can be indirectly adjusted by adjusting the exhaust ability of the exhaust port 30 while replenishing necessary components. Accordingly, the components ratio in the resist peeling solution can be suitably controlled on the basis of any one of the procedures (1), (2) and (3). In particularly, as compared with the procedure (1), the procedure (2) or (3), which makes use of the adjustment of the exhaust ability of the exhaust port 30, can desirably stabilize the added amount of the necessary components. That is to say, the procedure (2) or (3) is superior to the procedure (1) in terms of stabilization of the components ratio in the resist peeling solution in the peeling solution tank 14.

Replenishing only water as the added component or replenishing both water and organic amine as the added components may perform the continuous replenishment manner. The change in components ratio in the resist peeling solution is, as described above, mainly caused by evaporation of water, it is possible to suppress the change in components ratio in the resist peeling solution to some extent only by replenishing water as the added component. However, since a trace of organic amine disappears along with evaporation of water, it may be desirable to replenish a suitable amount of organic amine together with the replenished amount of water. In such a manner, as compared with the addition of water as the added component, the change in components ratio in the resist peeling solution can be more accurately suppressed.

The resist peeling system 10 in this embodiment performs the intermittent replenishment in accordance with the following procedure.

The intermittent replenishment is performed, as described above, to compensate the loss of the resist peeling solution due to the carryout of the resist peeling solution by adhesion thereof on the semiconductor wafers 16. Accordingly, the intermittent replenishment manner is generally carried out by replenishing a new resist peeling solution as the added component. If the electric conductivity of the resist peeling solution becomes largely out of the standard value, water, or water and organic amine are replenished as the added components to make the components ratio in the resist peeling solution in the peeling solution tank 14 close to the components ratio in the new resist peeling solution.

According to this embodiment, the intermittent replenishment of the added components is performed directly after the lot of the semiconductor wafers 16 are carried out of the peeling solution tank 14. By setting the timing of the intermittent replenishment as described above, even if the components ratio in the resist peeling solution in the peeling solution tank 14 rapidly changes, it is possible to prevent the effect from being exerted on the semiconductor wafers 16. As a result, according to the resist peeling system 10 in this embodiment, it is possible to stably perform resist peeling treatment of the semiconductor wafers 16 while carrying out the intermittent replenishment.

Next, countermeasures to be taken when an abnormality occurs at the electric conductivity monitor 46 or the mechanism of supplying the added components will be described.

According to the resist peeling system 10 in this embodiment, if an abnormality occurs at the mechanism for supplying the added components or the like, there is a possibility that the components ratio in the resist peeling solution in the peeling solution tank 14 is out of a range suitable for execution of the resist peeling treatment. Accordingly, if the electric conductivity monitored by the electric conductivity monitor 46 is out of the predetermined standard range or a rapid change in electric conductivity appears, the resist peeling system 10 decides that an abnormality has occurred therein and takes the following countermeasure.

When the above abnormality is detected, the new loading of the in-process lot into the resist peeling system 10 is immediately prohibited. With this countermeasure, there is prevented the process defect due to the abnormality of the component ratio in the resist peeling solution.

When the above abnormality is detected, the dipping in the resist peeling solution of the semiconductor wafers 16 of the lot in the peeling solution tank 14 is interrupted, then the semiconductor wafers 16 are dipped in the next tank, that is, the second tank 22. With this countermeasure, it is possible to effectively prevent the undesirable corrosion of the semiconductor wafers 16.

The above countermeasure to be taken for the lot in the peeling solution tank 14 may be replaced with the following countermeasure: namely, when an abnormality of the resist peeling solution is detected on the basis of the electric conductivity, the "Quick Dump" of the resist peeling solution is immediately performed by opening the solution discharge port 43 provided in the peeling solution tank 14. Then, after the solution discharge port 43 is closed, a resist peeling solution at a low temperature whose chemical reaction is negligible, that is, a new resist peeling solution at room temperature is supplied from the new-solution tank 40 into the peeling solution tank 14. With this countermeasure, it is possible to minimize the damages of the semiconductor wafers 16 and hence to enhance the safety of the semiconductor wafers 16 upon occurrence of the abnormality.

In the first embodiment, the components ratio in the resist peeling solution is estimated only on the basis of the electric conductivity thereof; however, to accurately detect the components ratio in the resist peeling solution, the component analysis using an absorption-photo meter may be combined with the estimation based on the electric conductivity. The estimation based on the electric conductivity, which is the manner of indirectly estimating the components ratio in the resist peeling solution, is advantageous in that the composition can be rapidly estimated but is disadvantageous in that the estimation accuracy is poor. Meanwhile, the component analysis using an absorption-photo meter, which is the manner of directly detecting the components ratio in the resist peeling solution, cannot rapidly analyze the composition but is advantageous in that the composition can be accurately analyzed. Accordingly, by the combination of both the manners, it is possible to compensate the disadvantages of both the manners with each other, and hence to realize a control manner capable of rapidly, highly accurately controlling the added amounts of the necessary components of the resist peeling solution.

The major benefits of the present invention described above are summarized as follows:

According to the first aspect of the present invention, the components ratio in a resist peeling solution is estimated on the basis of the electric conductivity thereof before a component lacking for the resist peeling solution is replenished thereto. As a result, the loss of the resist peeling solution due to the change of the same with time is compensated, whereby the components ratio in the resist peeling solution is kept at a suitable value for a long period of time.

According to the second aspect of the present invention, a suitable amount of water is replenished on the basis of the electric conductivity of the resist peeling solution. The change of the resist peeling solution with time is mainly dependent on the evaporation of water. Further, the electric conductivity of the resist peeling solution has a strong correlation with the water ratio. As a result, the components ratio in the resist peeling solution is effectively and accurately kept at a suitable value.

According to the third aspect of the present invention, the insufficient component heated at a suitable temperature is replenished to the peeling solution tank in order to suppress the change in temperature of the resist peeling solution in the tank. Such a procedure is effective to stabilize the condition of the resist peeling treatment.

According to the fourth aspect of the present invention, the continuous replenishment is carried out in accordance with the continuous change of the resist peeling solution while the intermittent replenishment is carried out in accordance with the intermittent change of the same caused by processing semiconductor wafers. As a result, the components ratio in the resist peeling solution is effectively and accurately kept at a suitable value.

According to the fifth aspect of the present invention, the intermittent replenishment for the insufficient component is performed after semiconductor wafers are carried out of the peeling solution tank. As a result, even if the components ratio in the resist peeling solution rapidly changes accompanied by replenishment of the insufficient component, the effect is certainly prevented from being exerted on the semiconductor wafers.

According to the sixth aspect of the present invention, the insufficient component is replenished to the circulating path at a position on the downstream side from the position at which the electric conductivity is monitored. As a result, the present invention monitors the electric conductivity of the resist peeling solution that has flowed from the peeling solution tank and has not being replenished with the insufficient component yet, that is, monitors the electric conductivity accurately representing the components ratio in the peeling solution tank.

According to the seventh aspect of the present invention, the change of the resist peeling solution with time is controlled by adjusting the ability of the exhaust mechanism for exhausting a surrounding atmosphere of the peeling solution tank. To be more specific, the present invention forms an environment, in which a component such as water contained in the resist peeling solution disappears at a specific rate, by adjusting the exhaust ability. Such an environment stabilizes the amount of the insufficient component to be replenished to the resist peeling solution with time, and hence stabilizing the treatment condition.

According to the eighth aspect of the present invention, since the component analysis using an absorption-photo meter is combined with the estimation of the composition based on the electric conductivity, the components ratio in the resist peeling solution is detected rapidly and accurately.

According to the ninth aspect of the present invention, it is prohibited to newly carry semiconductor wafers in the peeling solution tank when an abnormality of the components ratio is detected in the resist peeling solution occurs. As a result, failures of the semiconductor wafers are effectively prevent from arising.

According to the tenth aspect of the present invention, the semiconductor wafers in the peeling solution tank is immediately carried to the subsequent step when an abnormality of the components ratio is detected in the resist peeling solution. As a result, there is minimized the loss of the semiconductor wafers due to the abnormality of the resist peeling solution.

According to the eleventh aspect of the present invention, the resist peeling solution in the peeling solution tank is immediately replaced with a new solution at about room temperature when an abnormality of the components ratio is detected in the same. As a result, there is minimized the loss of the semiconductor wafers due to the abnormality of the resist peeling solution.

According to the twelfth aspect of the present invention, since the resist peeling solution used in the process of fabricating semiconductor wafers can be kept in a economically suitable state, it is possible to realize semiconductor devices which have a stable quality and can be fabricated at a low cost.

Further, the present invention is not limited to these embodiments, but variations and modifications may be made without departing from the scope of the present invention.

The entire disclosure of Japanese Patent Application No. 2000-33789 filed on Feb. 10, 2000 including specification, claims, drawings and summary are incorporated herein by reference in its entirety.

What is claimed is:

1. A resist peeling system for peeling resist residue adhering on a semiconductor wafer by using a resist peeling solution composed of multiple components, said resist peeling system comprising:

a peeling solution tank for storing said resist peeling solution;

an electric conductivity monitor for monitoring the electric conductivity of said resist peeling solution;

a means for estimating the components ratio in said resist peeling solution on the basis of said electric conductivity; and a component adding mechanism for adding, when a component of said resist peeling solution is estimated to be insufficient on the basis of the result estimated by said estimating means, a suitable amount of the component estimated to be insufficient to said resist peeling solution, said component adding mechanism comprises a continuously replenishing mechanism for continuously adding the component estimated to be insufficient to said resist peeling solution and an intermittently replenishing mechanism for intermittently adding a new resist peeling solution or the component estimated to be insufficient, thereby compensating the loss of said resist peeling solution due to carry-out of said resist peeling solution by adhesion thereof on said semiconductor wafer.

2. The resist peeling system according to claim 1, wherein said intermittently replenishing mechanism performs the intermittent addition directly after said semiconductor wafer is carried out of said peeling solution tank.

3. A resist peeling system for peeling resist residue adhering on a semiconductor wafer by using a resist peeling solution composed of multiple components, said resist peeling system comprising:

a peeling solution tank for storing said resist peeling solution;

an electric conductivity monitor for monitoring the electric conductivity of said resist peeling solution;

a means for estimating the components ratio in said resist peeling solution on the basis of said electric conductivity;

a component adding mechanism for adding, when a component of said resist peeling solution is estimated to be insufficient on the basis of the result estimated by said estimating means, a suitable amount of the component estimated to be insufficient to said resist peeling solution; and a circulating path having a downstream side for taking out said resist peeling solution from said peeling solution tank and circulating said resist peeling solution in said resist peeling solution tank;

wherein said electric conductivity monitor monitors the electric conductivity of said resist peeling solution flowing in said circulating path and said component adding mechanism adds the component estimated to be insufficient to said circulating path on the downstream side from the position at which said electric conductivity monitor monitors said electric conductivity.

4. A resist peeling system for peeling resist residue adhering on a semiconductor wafer by using a resist peeling solution composed of multiple components, said resist peeling system comprising:

a peeling solution tank for storing said resist peeling solution;

an electric conductivity monitor for monitoring the electric conductivity of said resist peeling solution;

a means for estimating the components ratio in said resist peeling solution on the basis of said electric conductivity;

a component adding mechanism for adding, when a component of said resist peeling solution is estimated to be insufficient on the basis of the result estimated by said estimating means, a suitable amount of the component estimated to be insufficient to said resist peeling solution; and an exhaust mechanism for sucking and exhausting a surrounding atmosphere of said peeling solution tank, wherein said exhaust mechanism adjusts the exhaust ability on the basis of said electric conductivity.

5. A resist peeling system for peeling resist residue adhering on a semiconductor wafer by using a resist peeling solution composed of multiple components, said resist peeling system comprising:

a peeling solution tank for storing said resist peeling solution;

an electric conductivity monitor for monitoring the electric conductivity of said resist peeling solution;

a means for estimating the components ratio in said resist peeling solution on the basis of said electric conductivity;

a component adding mechanism for adding, when a component of said resist peeling solution is estimated to be insufficient on the basis of the result estimated by said estimating means, a suitable amount of the component estimated to be insufficient to said resist peeling solution; and a means for prohibiting the carry-in of a new semiconductor wafer in said peeling solution tank, if monitoring data representing the components ratio in said resist peeling solution exhibits that the components ratio is out of a specific control range, or if the monitoring data rapidly changes at a changing rate over a specific value.

6. A resist peeling system for peeling resist residue adhering on a semiconductor wafer by using a resist peeling solution composed of multiple components, said resist peeling system comprising:

a peeling solution tank for storing said resist peeling solution;

an electric conductivity monitor for monitoring the electric conductivity of said resist peeling solution;

a means for estimating the components ratio in said resist peeling solution on the basis of said electric conductivity;

a component adding mechanism for adding, when a component of said resist peeling solution is estimated to be insufficient on the basis of the result estimated by said estimating means, a suitable amount of the component estimated to be insufficient to said resist peeling solution; and a means for immediately carrying said semiconductor wafer in said peeling tank out of said peeling solution tank and carrying said semiconductor wafer to a usual subsequent step, if monitoring data representing the components ratio of said resist peeling solution exhibits that the components ratio is out of a specific control range, or if the monitoring data rapidly changes at a changing rate over a specific value.

7. A resist peeling system for peeling resist residue adhering on a semiconductor wafer by using a resist peeling solution composed of multiple components, said resist peeling system comprising:

a peeling solution tank for storing said resist peeling solution;

an electric conductivity monitor for monitoring the electric conductivity of said resist peeling solution;

a means for estimating the components ratio in said resist peeling solution on the basis of said electric conductivity;

a component adding mechanism for adding, when a component of said resist peeling solution is estimated to be insufficient on the basis of the result estimated by said estimating means, a suitable amount of the component estimated to be insufficient to said resist peeling solution; and a means for immediately discharging said resist peeling solution in said peeling solution tank and supplying a new resist peeling solution kept at about room temperature in said peeling solution tank, if monitoring data representing the components ratio of said resist peeling solution exhibits that the components ratio is out of a specific control range, or if the monitoring data rapidly changes at a changing rate over a specific value.

8. A method of controlling a resist peeling solution composed of multiple components for peeling resist residue adhering on a semiconductor wafer, said method comprising the steps of:

monitoring the electric conductivity of the resist peeling solution stored in a peeling solution tank;

estimating the components ratio of said resist peeling solution on the basis of said electric conductivity; and adding, when a component of said resist peeling solution is estimated to be insufficient on the basis of the estimated result, a suitable amount of said component to said resist peeling solution, wherein said step of adding said component comprises the sub-steps of continuously adding said component and intermittently adding a new resist peeling solution or said component, thereby compensating the loss of said resist peeling solution due to carry-out of said resist peeling solution by adhesion thereof on said semiconductor wafer.

9. The method of controlling a resist peeling solution according to claim 8, wherein said sub-step of intermittently adding said component is performed directly after said semiconductor wafer is carried out of said peeling solution tank.

10. A method of controlling a resist peeling solution composed of multiple components for peeling resist residue adhering on a semiconductor wafer, said method comprising the steps of:

monitoring the electric conductivity of the resist peeling solution stored in a peeling solution tank, said monitoring of the electric conductivity is performed targeting said resist peeling solution having flowed from said peeling solution tank into a circulating path having a downstream side;

estimating the components ratio of said resist peeling solution on the basis of said electric conductivity; and adding, when a component of said resist peeling solution is estimated to be insufficient on the basis of the estimated result, a suitable amount of said component to said circulating path at a position on the downstream side from the position at which the electric conductivity is monitored, said component flows in said peeling solution tank together with said resist peeling solution flowing along said circulating path.

11. A method of controlling a resist peeling solution composed of multiple components for peeling resist residue adhering on a semiconductor wafer, said method comprising the steps of:

monitoring the electric conductivity of the resist peeling solution stored in a peeling solution tank;

estimating the components ratio of said resist peeling solution on the basis of said electric conductivity;

adding, when a component of said resist peeling solution is estimated to be insufficient on the basis of the estimated result, a suitable amount of said component to said resist peeling solution;

providing an exhaust mechanism for sucking and exhausting a surrounding atmosphere of said peeling solution tank on the basis of the electric conductivity of said resist peeling solution; and adjusting the exhaust ability of said exhaust mechanism.

12. A method of controlling a resist peeling solution composed of multiple components for peeling resist residue adhering on a semiconductor wafer, said method comprising the steps of:

monitoring the electric conductivity of the resist peeling solution stored in a peeling solution tank;

estimating the components ratio of said resist peeling solution on the basis of said electric conductivity;

adding, when a component of said resist peeling solution is estimated to be insufficient on the basis of the estimated result, a suitable amount of said component estimated to said resist peeling solution; and analyzing the components ratio of said resist peeling solution by using an absorption-photo meter, wherein the amount of said component added to said resist peeling solution is estimated from the electric conductivity and the composition analyzed by using said absorption-photo meter.

13. A method of controlling a resist peeling solution composed of multiple components for peeling resist residue adhering on a semiconductor wafer, said method comprising the steps of:

monitoring the electric conductivity of the resist peeling solution stored in a peeling solution tank;

estimating the components ratio of said resist peeling solution on the basis of said electric conductivity;

adding, when a component of said resist peeling solution is estimated to be insufficient on the basis of the estimated result, a suitable amount of said component to said resist peeling solution;

detecting that monitoring data representing the components ratio of said resist peeling solution exhibits that the composition is out of a specific control range, or that the monitoring data rapidly changes at a changing rate over a specific value; and prohibiting the carry-in of a new semiconductor wafer in said peeling solution tank when either of said two states is detected.

* * * * *